United States Patent [19]

Koshino et al.

[11] Patent Number: 4,710,794
[45] Date of Patent: Dec. 1, 1987

[54] COMPOSITE SEMICONDUCTOR DEVICE

[75] Inventors: Yutaka Koshino, Yokosuka; Tatsuo Akiyama, Tokyo; Yoshiro Baba, Yokohama, all of Japan

[73] Assignee: Kabushiki Kaisha Toshiba, Kawasaki, Japan

[21] Appl. No.: 828,536

[22] Filed: Feb. 12, 1986

[30] Foreign Application Priority Data

Feb. 13, 1985 [JP] Japan ................................. 60-24389

[51] Int. Cl.$^4$ ..................... H01L 27/12; H01L 29/06; H01L 25/04
[52] U.S. Cl. ........................................ 357/49; 357/28; 357/55; 357/56; 357/82; 357/88
[58] Field of Search ....................... 357/49, 55, 56, 88, 357/82, 28

[56] References Cited

U.S. PATENT DOCUMENTS

| 3,412,296 | 11/1968 | Grebene | 317/234 |
| 4,411,060 | 10/1983 | Cho | 29/576 |
| 4,467,521 | 8/1984 | Spooner et al. | 29/576 E |
| 4,638,552 | 1/1987 | Shimbo et al. | 357/49 |
| 4,661,832 | 4/1987 | Lechaton et al. | 357/49 |

FOREIGN PATENT DOCUMENTS

| 0098374 | 1/1984 | European Pat. Off. | 357/49 |
| 0147626 | 11/1984 | European Pat. Off. | 357/49 |
| 2832152 | 1/1979 | Fed. Rep. of Germany | 357/49 |

OTHER PUBLICATIONS

Mutter, "Selective Filling of Isolation Trenches in Silicon," IBM Technical Disclosure Bulletin, vol. 25, No. 11B, pp. 6114-6115, 4/83.

Primary Examiner—Martin H. Edlow
Assistant Examiner—D. Featherstone
Attorney, Agent, or Firm—Finnegan, Henderson, Farabow, Garrett & Dunner

[57] ABSTRACT

Disclosed is a composite semiconductor device, comprising a composite substrate consisting of first and second semiconductor substrates, one surface of each of which is mirror-polished, so that the mirror-polished surfaces are bonded together. The first semiconductor substrate has a space adjacent to the bonding interface, and an annular groove which communicates with the space from a surface of the first semiconductor substrate opposite the bonding interface, the annular groove being formed in a portion of the first semiconductor substrate corresponding to a peripheral edge portion of the space thereof, at least one pillar projecting through the space to the bonding interface from a surface, which is exposed to the space, of a first portion of the first semiconductor substrate which is defined by the space and the annular groove, a first insulating layer, formed in the annular groove, for electrically isolating the first portion from a second portion of the first semiconductor substrate adjacent thereto, a second insulating layer, formed on the pillar or a bonding interface between the pillar and the second semiconductor substrate, for electrically isolating the first portion from the second semiconductor substrate, a first functional element formed in the first portion, and a second functional element formed in the second portion.

6 Claims, 13 Drawing Figures

— 1 —

COMPOSITE SEMICONDUCTOR DEVICE

BACKGROUND OF THE INVENTION

I. Field of the Invention

The present invention relates to a composite semiconductor device and, more particularly, to a composite semiconductor device which consists of a high voltage power element and an integrated circuit formed on one chip and which has a deep element isolation region.

II. Description of the Prior Art

A conventional composite semiconductor device consisting of a high voltage power element and an integrated circuit formed on one chip will be described with reference to FIG. 1.

FIG. 1 is a sectional view showing a semiconductor device in which a power transistor section formed from the upper to lower surface of the semiconductor device and an IC section for controlling the transistor section are formed on one chip. Referring to FIG. 1, n-type epitaxial layer 22 is formed on a p-type semiconductor substrate 21. Epitaxial layer 22 is divided into a power transistor section and a control IC section. Power transistor 30 in the power transistor section comprises n-type base region 25, forming part of epitaxial layer 22, $p^+$-type emitter region 24 and $n^+$-type base contact region 25a formed in base region 25, and p-type collector layer 21 and $p^+$-type collector contact layer 26 constituting the semiconductor substrate. Collector electrode 27 is formed on the bottom surface of the structure.

The control IC section comprises active elements (e.g., bipolar or MOS transistors) and passive elements (e.g., resistors, capacitors, and the like) formed in the epitaxial layer. The number of elements differs depending on the type of device, but in general, several elements are formed. In FIG. 1, p-channel MOS transistor 31 and bipolar transistor 32 are exemplified as active elements.

$p^{++}$-type region 23 isolates the power transistor section from the control IC section and reaches as far as p-type collector layer 21. Epitaxial layer 22, in which the control IC section is formed, is thus surrounded by region 23 and collector layer 21. More specifically, a pn junction is formed around the control IC section. Normally, since collector electrode 27 is fixed at a minimum potential in the substrate, the pn junction is reverse-biased during turn-on of the device, thus forming a depletion layer which performs element isolation.

However, this conventional isolation technique using a pn junction has the following drawbacks.

(a) Since element isolation is performed using a depletion layer formed when the pn junction is reverse-biased, the breakdown voltage is limited to about 300 V. Therefore, when a 1,000 V class high voltage element (e.g., a power transistor) is to be formed, this isolation technique cannot provide a breakdown voltage high enough to form the element together on one chip with a control IC.

(b) Even when a 300 V class power element is to be formed, impurity diffusion must be performed to a depth of 40 μm or more in order to form a pn junction for isolation, a time consuming process. Since the diffusion width along the lateral direction is increased, the size of the element formation region is reduced.

(c) A power element normally generates a large amount of heat, thus increasing the temperature of the pellet. A control IC section formed together on one chip with the power element is directly influenced by increases in temperature, and can easily malfunction.

SUMMARY OF THE INVENTION

It is an object of the present invention to provide a composite semiconductor device which is free from the above-mentioned drawbacks of a conventional element isolation technique using a pn junction, which can provide element isolation with a high breakdown voltage, and which has a structure in which elements adjacent to a power transistor are not easily influenced by heat generated by the power transistor.

According to the present invention, there is provided a composite semiconductor device, comprising:

a composite substrate consisting of first and second semiconductor substrates, one surface of each of which is mirror-polished, so that the mirror-polished surfaces are bonded together, the first semiconductor substrate having a space adjacent to the bonding interface and an annular groove which communicates with the space from a surface of the first semiconductor substrate opposite the bonding interface, the annular groove being formed in a portion of the first semiconductor substrate corresponding to a peripheral edge portion of the space thereof;

at least one pillar projecting through the space to the bonding interface from a surface, which is exposed to the space, of a first portion of the first semiconductor substrate which is defined by the space and the annular groove;

a first insulating layer, formed in the annular groove, for electrically isolating the first portion from a second portion of the first semiconductor substrate adjacent thereto;

a second insulating layer, formed on the pillar or a bonding interface between the pillar and the second semiconductor substrate, for electrically isolating the first portion from the second semiconductor substrate;

a first functional element formed in the first portion; and a second functional element formed in the second portion.

The annular groove can be filled with the first insulating layer but need not be completely filled, and the first insulating layer can be formed only on its side walls. In this case, the groove is completely filled with a filling material by a CVD process. Although an insulating material such as $SiO_2$, $Si_3N_4$, or the like can be used as the filling material, polycrystalline silicon having substantially the same thermal expansion coefficient as the silicon substrate is preferable.

A bonding layer is normally formed at a bonding interface between the first and second semiconductor substrates.

Furthermore, according to the present invention, there is provided a process for manufacturing a composite semiconductor device comprising the steps of:

mirror-polishing one surface of a first semiconductor substrate;

mirror-polishing one surface of a second semiconductor substrate;

selectively etching the mirror-polished surface of the first semiconductor substrate so as to form a recess and in the recess at least one pillar projecting from a bottom portion of the recess to the mirror-polished surface;

heating the first and second semiconductor substrates after the mirror-polished surfaces thereof have been placed in contact with each other so as to bond them together, thereby forming a composite substrate in which a space including at least one pillar is formed;

etching a portion of the first semiconductor substrate corresponding to a peripheral edge portion of the space thereof so as to form an annular groove extending to the space and forming a first portion which is defined by the annular groove and the space and is supported by the pillar;

performing thermal oxidation so as to form an oxide film on a surface, which is exposed to the annular groove and the space, of the composite substrate, whereby the first portion is electrically isolated from a second portion of the first semiconductor substrate, which is adjacent thereto, and the second semiconductor substrate;

forming a first functional element in the first portion; and forming a second functional element in the second portion.

In the method of the present invention, the surface roughness of the mirror-polished surface is preferably 500 Å or less. Note that "surface roughness" is given by a maximum height (Rmax) defined by JIS B-0601 (1982). An optical polishing method can be adopted as a mirror polishing method.

After the mirror-polishing step, the mirror-polished surface is preferably washed with water, surfactant, organic solvent, acid solution, or the like to remove stain films or contaminants (e.g., fine particles, absorbed ions, organic material, or inorganic material).

The mirror-polished surfaces of the first and second semiconductor substrates must be bonded in a clean atmosphere.

The heating temperature for bonding preferably falls within the range of 1,000° to 1,200° C. High temperatures, at which the first and second semiconductor substrates may fuse together, should be avoided.

In the composite semiconductor device of the present invention, the first functional element is reliably isolated from the second functional element by the deep insulating layer, thus achieving element isolation with a high breakdown voltage. The first functional element will not be influenced by heat from the second functional element due to the presence of the space therebetween.

DETAILED DESCRIPTION OF THE PREFERRED EMBODIMENTS

The present invention will now be described by way of examples with reference to the accompanying drawings.

EXAMPLE 1

Figure 1:
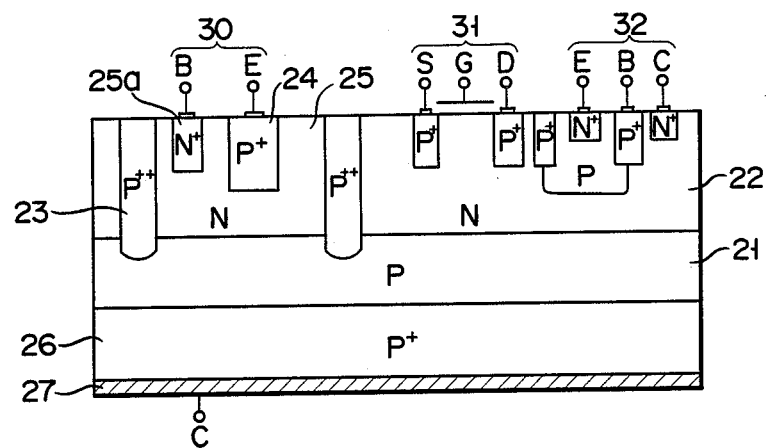
FIG. 1 is a sectional view of a conventional composite semiconductor device.
Figure 2:
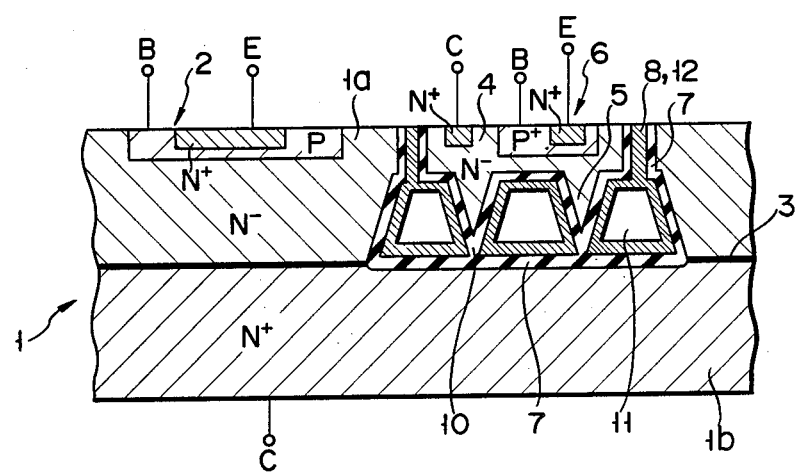
FIG. 2 is a sectional view of a composite semiconductor device according to an embodiment of the present invention.

In the composite semiconductor device shown in FIG. 2, vertical type power transistor 2 as a second functional element, and an IC, as a first functional element, for controlling transistor 2, are formed in composite silicon substrate 1. In FIG. 2, only planar transistor 6 is shown as a component of the control IC.

Composite silicon substrate 1 is formed by bonding together $n^-$-type first silicon substrate 1a and $n^+$-type second silicon substrate 1b. IC forming portion 4, in which the control IC is formed, is a rectangular plate-like surface layer in first silicon substrate 1a having a thickness of about 20 μm. Two pillars 5 are formed on the bottom surface of portion 4. The side surfaces of portion 4 are covered with silicon oxide layer 7 and filling material layer 8. Portion 4 is thus isolated from the remaining portion of substrate 1a by layers 7 and 8.

Space 11 is formed below portion 4 in substrate 1a, and two pillars 5 project downward in space 11 from the bottom surface of portion 4. Surfaces of substrates 1a and 1b (including the surfaces of pillars 5) exposed to space 11 are covered with silicon oxide layer 7 and filling material layer 8. Silicon oxide layer 10 is sandwiched between pillars 5 and substrate 1b to isolate them from each other. In this way, portion 4 and pillars 5 projecting therefrom are electrically isolated from the remaining portion of substrate 1a and from substrate 1b.

Vertical type npn transistor 2 is formed in the remaining portion of substrate 1a. The collector contact layer of transistor 2 is formed on a surface opposite the bonding surface of substrate 1b.

Figure 3A:
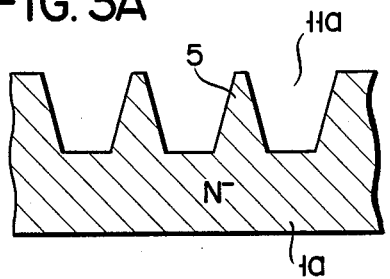
FIGS. 3A to 3F are sectional views showing steps in the manufacture of the device shown in FIG. 2.
Figure 3B:
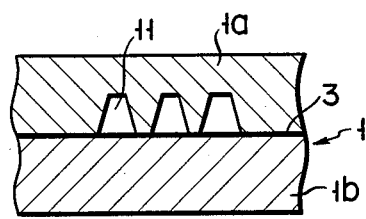
Figure 3C:
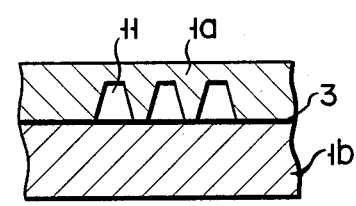
Figure 3D:
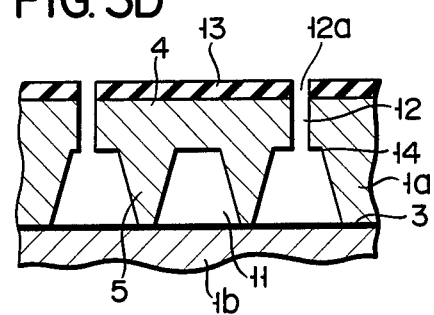
Figure 3E:
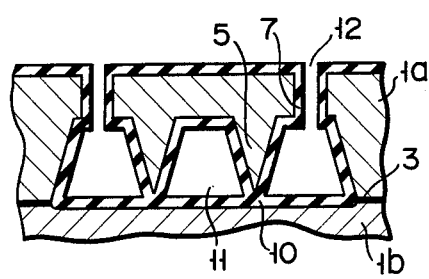
Figure 3F:
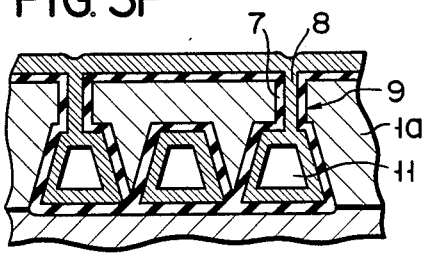
Figure 4:
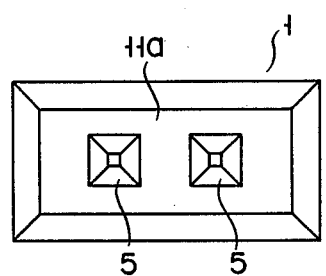
FIG. 4 is a plan view of FIG. 3A.

The composite semiconductor device is prepared as follows. FIGS. 3A to 3F are sectional views showing major steps in the manufacture of the device of the present invention, and FIG. 4 is a plan view of substrate 1a after the step in FIG. 3A. $N^-$-type first silicon substrate 1a and $n^+$-type second silicon substrate 1b are prepared. One surface of each is mirror-polished to obtain a surface roughness of 500 Å or less, thus forming first and second mirror-polished surfaces. Substrates 1a and 1b can be degreased if needed. Rectangular recess 11a having a mesa cross-section and a depth of about 80 μm is then formed in the first mirror-polished surface of substrate 1a. Substrate 1a is patterned to leave two pillars 5 in recess 11a, as shown in FIG. 3A. Mesa recess 11a is formed by chemical etching using an oxide film (not shown) as a mask, but can be formed by reactive ion etching (to be referred to as RIE hereinafter) (FIGS. 3A and 4).

The first and second mirror-polished surfaces of substrates 1a and 1b are placed in contact with each other in a clean atmosphere so that no foreign substances are present therebetween, and are then heated to 1,200° C. to be bonded together. This is performed by a vacuum heating apparatus. Note that reference numeral 3 denotes a bonding layer formed at the boundary between substrates 1a and 1b (FIG. 3B). Next, the surface of substrate 1a is lapped to reduce its thickness to 100 82 m, so that the thickness of the portion of substrate 1a above recess 11 is reduced to 20 μm (FIG. 3C). 3-μm thick oxide ($SiO_2$) film 13 is formed on the lapped surface of substrate 1a. A resist is patterned by a photo-etching process method (PEP method), and annular groove 12a is formed in the portion of film 13 corresponding to the peripheral edge portion of recess 11 by RIE. Substrate 1a is then etched by RIE using film 13 as a mask to form annular groove 12, which extends to recess 11. Thus, recess 11 is open to the outer atmosphere through groove 12. Portion (the same as the IC forming portion above) 4 of substrate 1a (thickness: 20 μm) lying on recess 11 is separated from the remaining portion of substrate 1a by groove 12, but can be supported by two pillars 5 so as not to be broken (FIG. 3D). Thermal oxidation is then performed via groove 12 in a wet oxygen atmosphere. This is continued until insulating oxide layer 10 is formed between pillars 5 and substrate 1b and until pillars 5 are electrically isolated from bonding layer 3 and substrate 1b adjacent thereto. At the same time, oxide layer 7 is formed on the side walls of groove 12 and the surfaces of pillars 5. Thermal oxidation time is determined by an external oxide layer thickness monitor or test samples. In this example, insulating layer 10 is formed on the bottom portions of pillars 5. In general, however, the insulating layer is formed on the portion of a pillar which is thinnest and oxidizes most easily (FIG. 3E). Groove 12, whose side walls were oxidized, is filled with polycrystalline silicon by a reduced-pressure CVD method, thus air-tightly sealing recess 11.

Polycrystalline silicon is also deposited on the inner surface of recess 11. However, this deposited portion is not related to the present invention. In this example, filling material layer 8, formed by filling groove 12 with a filling material, seals recess 11, flattens the exposed surface of substrate 1a, and prevents attachment of foreign substances to recess 11 which cannot be removed later. Since recess 11 is sealed under reduced pressure, internal air will not expand in subsequent heating process, thus preventing damage to the substrate.

The polycrystalline silicon film, oxide film, and the like attached to the surface of the substrate are removed, and a control IC and power transistor 2 are formed in IC forming portion 4 and in the remaining portion, respectively, of substrate 1a. Substrate 1b acts as the collector contact layer of power transistor 2. In this case, the effect of the barrier caused by bonding layer 3 between substrates 1a and 1b on the function of power transistor 2 is negligible.

EXAMPLE 2

Figure 5A:
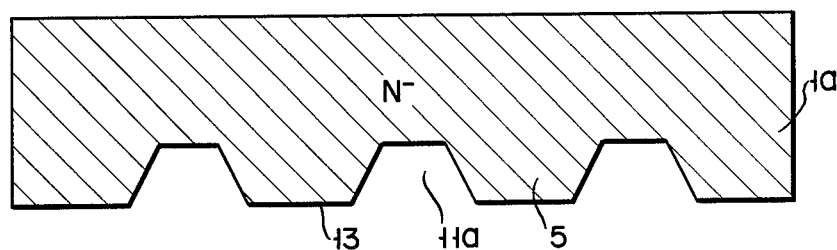
FIGS. 5A to 5C are sectional views showing steps in the manufacture of a composite semiconductor device according to another embodiment of the present invention.
Figure 5B:
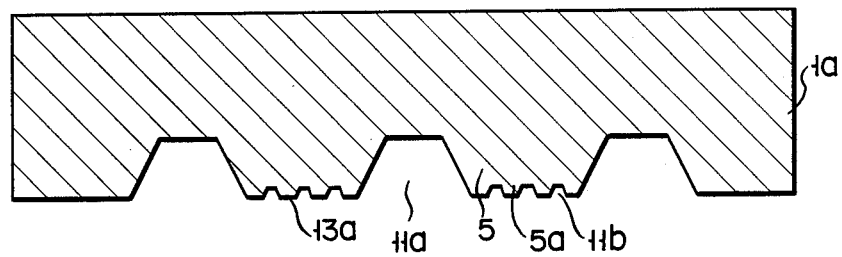
Figure 5C:
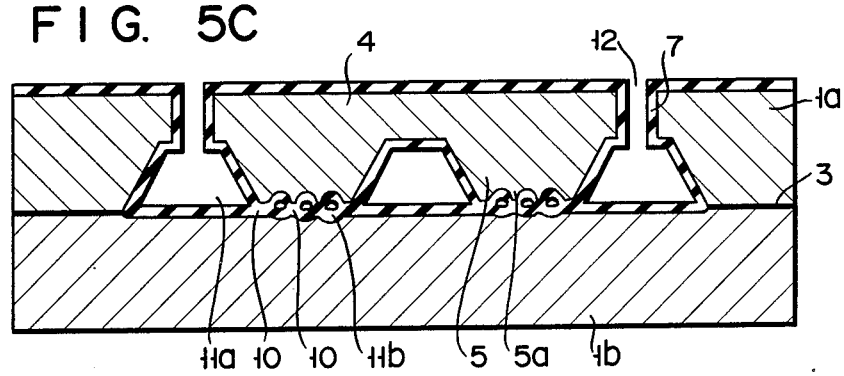
Figure 6:
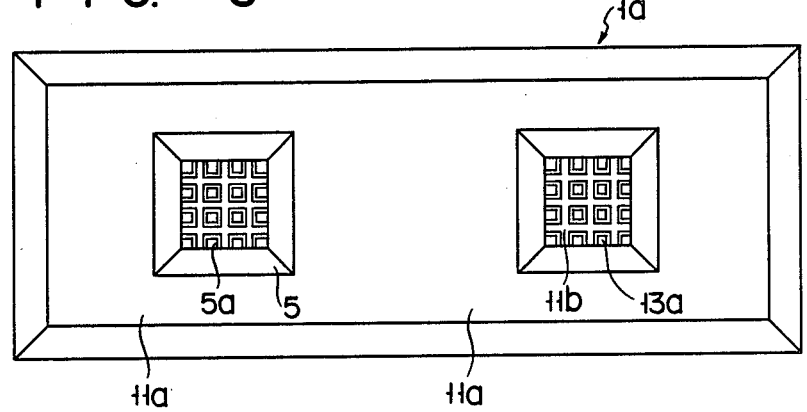
FIG. 6 is a plan view of FIG. 5A.

In this example, the mesa etching step for forming a recess and pillars in substrate 1a is performed in two steps (i.e., deep and shallow etching steps), thus allowing easy control. FIG. 5A is a sectional view showing substrate 1a after deep mesa etching. More specifically, 80-μm rectangular recess 11a having a mesa cross-section is formed in a first mirror-polished surface of substrate 1a by deep chemical etching. In this case, two pillars 5 are left in the recess region. However, it is difficult to leave bonding surface 13, which will subsequently be bonded to substrate 1b, with high precision by this etching method. Therefore, bonding surface 13 is formed with less precision and a larger area than in Example 1. FIG. 5B is a sectional view of substrate 1 after shallow mesa etching, and FIG. 6 is a plan view thereof. With this etching step, a plurality (e.g., 16) of short pillars 5a are formed on surface 13. For example, bonding surface 13a of each pillar 5a has an area of 2 μm². Shallow mesa recess 11b is connected with deep recess 11a. FIG. 5C corresponds with FIG. 3E in Example 1 and is a sectional view showing the state after annular groove 12 was formed and thermal oxidation was performed. With the thermal oxidation step, insulating oxide layer 10 is formed in the same manner as in Example 1, and pillars 5a are electrically isolated from substrate 1b. At the same time, oxide layer 7 is formed on the side walls of groove 12 and the surfaces of pillars 5 and 5a. IC forming portion 4 is dielectrically separated from the remaining portion of substrate 1a and from substrate 1b. The other steps are the same as those in Example 1.

In Examples 1 and 2, it is preferable that an n+-type impurity be ion-implanted in substrate 1a so as to form an n+-type region on the inner surfaces of recesses 11a after pillars 5 are formed by selective etching. In this way, the series resistance of the collector can be reduced.

As shown in Examples 1 and 2, in a composite semiconductor device prepared in accordance with the method of the present invention, an isolation breakdown voltage of 1,000 V or higher, impossible to obtain with the conventional pn junction separation method, can be realized. Since a large area of an IC forming portion for a control IC is adjacent to a space, heat from a power element (e.g., a power transistor) can be dispersed, and changes in IC characteristics due to heat can be reduced. In addition, isolation capacity and parasitic element effects are reduced when compared with conventional devices, thus providing a stable composite semiconductor device with high reliability.

What is claimed is:

1. A composite semiconductor device, comprising:
   a composite substrate including first and second semiconductor substrates, one surface of each of said substrates being mirror-polished, with said mirror-polished surfaces being bonded together at a bonding interface, said first semiconductor substrate having a space adjacent to said bonding interface and an annular insulating layer embedded therein and extending from a surface of said first semiconductor substrate opposite the bonding interface to a peripheral edge portion of said space, said space and insulating layer defining a first portion of said first semiconductor substrate said first portion being electrically isolated from a second portion of said first semiconducotr substrate adjacent thereto and from said second semiconductor substrate;
   at least one pillar extending from a bottom of said first portion to said interface, for supporting said first portion;
   a first functional element formed in said first portion; and a second functional element formed in said second portion.

2. A device according to claim 1, wherein said insulating layer is formed on side walls of an annular groove formed in said first semiconductor substrate, and wherein said annular groove is filled with a filling material formed on said insulating layer.

3. A device according to claim 2, wherein an insulating layer is formed on the surface of said composite semiconductor substrate, said insulating layer being exposed to said annular groove and said space, and wherein said filling material layer is formed on said insulating layer.

4. A device according to claim 2, wherein said filling material comprises an element selected from the group onsisting of $SiO_2$, $Si_3N_4$, and polycrystalline Si.

5. A device according to claim 1, wherein said pillar is tapered toward said bonding interface, and a root of said pillar is comprised of an insulating material which electrically isolates said first portion from said second semiconductor substrate.

6. A device according to claim 1, wherein said second functional element is a power element, and said first functional element is an integrated circuit for controlling said power element.

* * * * *

UNITED STATES PATENT AND TRADEMARK OFFICE
CERTIFICATE OF CORRECTION

PATENT NO. : 4,710,794

DATED : December 1, 1987

INVENTOR(S) : KOSHINO ET AL.

It is certified that error appears in the above-identified patent and that said Letters Patent is hereby corrected as shown below:

Claim 4, column 6, line 58, "onsisting" should be --consisting--.

Signed and Sealed this

Twenty-seventh Day of September, 1988

*Attest:*

DONALD J. QUIGG

*Attesting Officer*  *Commissioner of Patents and Trademarks*